US012684761B2

(12) United States Patent
Lai et al.

(10) Patent No.: US 12,684,761 B2
(45) Date of Patent: Jul. 14, 2026

(54) SEMICONDUCTOR DEVICE WITH AN ELECTRICALLY CONDUCTIVE STRUCTURE HAVING A CAPPING LAYER SIDEWALL DIRECTLY CONTACTING A CONTACT STRUCTURE AND MANUFACTURING METHOD THEREOF

(71) Applicant: Fujian Jinhua Integrated Circuit Co., Ltd., Quanzhou City (CN)

(72) Inventors: Huixian Lai, Quanzhou City (CN); Li-Wei Feng, Quanzhou City (CN)

(73) Assignee: Fujian Jinhua Integrated Circuit Co., Ltd., Quanzhou City (CN)

( * ) Notice: Subject to any disclaimer, the term of this patent is extended or adjusted under 35 U.S.C. 154(b) by 423 days.

(21) Appl. No.: 18/220,290

(22) Filed: Jul. 11, 2023

(65) Prior Publication Data

US 2024/0397703 A1     Nov. 28, 2024

(30) Foreign Application Priority Data

May 25, 2023     (CN) .......................... 202310597432.4

(51) Int. Cl.
    *H10B 12/00*         (2023.01)
    *H10D 30/01*         (2025.01)
                (Continued)

(52) U.S. Cl.
    CPC ........... *H10B 12/36* (2023.02); *H10B 12/056* (2023.02); *H10B 12/482* (2023.02);
                (Continued)

(58) Field of Classification Search
    CPC ............ H10B 12/05–056; H10B 12/34; H10B 12/36; H10B 12/488; H10B 12/09; H10B 12/50
    See application file for complete search history.

(56) References Cited

U.S. PATENT DOCUMENTS 10,312,243 B2     6/2019   Lee
10,964,794 B2     3/2021   Yoo
                (Continued)

FOREIGN PATENT DOCUMENTS

CN          110021599 A        7/2019
CN          113363327 A        9/2021

*Primary Examiner* — Younes Boulghassoul
(74) *Attorney, Agent, or Firm* — Winston Hsu

(57)     ABSTRACT

A semiconductor device and a manufacturing method thereof are provided. The semiconductor device includes a semiconductor substrate having a cell region and a peripheral region, a first stacked structure disposed in the semiconductor substrate, and a contact structure. The semiconductor substrate includes a fin-shaped structure. The first stacked structure is disposed straddling the fin-shaped structure, extends in a horizontal direction, and disposed in the cell region and the peripheral region. The first stacked structure includes an electrically conductive layer including a first portion in the cell region and a second portion in the peripheral region, a capping layer disposed on the electrically conductive layer, and a dielectric capping layer disposed on the capping layer and the electrically conductive layer. The dielectric capping layer contacts a top surface of the second portion. The contact structure directly contacts the electrically conductive layer and is electrically connected with the first stacked structure.

20 Claims, 16 Drawing Sheets

(51) Int. Cl.
*H10D 30/62* (2025.01)
*H10W 20/41* (2026.01)

(52) U.S. Cl.
CPC ......... *H10B 12/488* (2023.02); *H10D 30/024* (2025.01); *H10D 30/6211* (2025.01); *H10W 20/435* (2026.01); *H10B 12/50* (2023.02)

(56) References Cited

U.S. PATENT DOCUMENTS

| | | | | |
|---|---|---|---|---|
| 11,177,264 | B2 | 11/2021 | Jeon | |
| 11,329,050 | B2* | 5/2022 | Seong | H10B 12/053 |
| 11,411,010 | B2 | 8/2022 | Seong | |
| 11,917,812 | B2* | 2/2024 | Bae | H10B 12/0335 |
| 2015/0255464 | A1* | 9/2015 | Lee | H10D 64/017 |
| | | | | 438/237 |
| 2019/0206877 | A1* | 7/2019 | Kim | H10B 63/30 |
| 2021/0313330 | A1* | 10/2021 | Fujimoto | H10B 12/053 |
| 2022/0293510 | A1* | 9/2022 | Honda | H10B 12/00 |
| 2023/0363149 | A1* | 11/2023 | Bae | H10B 12/488 |
| 2024/0090207 | A1* | 3/2024 | Li | H10B 12/09 |
| 2024/0147696 | A1* | 5/2024 | Park | H10B 12/34 |
| 2024/0237334 | A1* | 7/2024 | Kim | H10B 12/50 |
| 2024/0306378 | A1* | 9/2024 | Ahn | H10B 12/34 |

* cited by examiner

OP3

46

44

OP3

40

T

39

37

39

35

33

40

10F

10

D3

SEMICONDUCTOR DEVICE WITH AN ELECTRICALLY CONDUCTIVE STRUCTURE HAVING A CAPPING LAYER SIDEWALL DIRECTLY CONTACTING A CONTACT STRUCTURE AND MANUFACTURING METHOD THEREOF

BACKGROUND OF THE INVENTION

1. Field of the Invention

The present invention relates to a semiconductor technical field, and more particularly, to a semiconductor device and a manufacturing method thereof.

2. Description of the Prior Art

Dynamic random access memory (DRAM) is a kind of volatile storage device which is an indispensable key part of many electronic products. DRAM includes a great number of memory cells arranged for forming an array configured to store data. Each of the memory cells may be composed of a metal oxide semiconductor (MOS) transistor and a capacitor connected in series.

The MOS transistor structure of the memory cell has many different structural designs because of considerations such as product requirements and/or memory cell density. Therefore, the MOS transistor structure of the memory cell may be different from the transistor structure in other regions on the same chip, and the manufacturing process becomes complicated accordingly. Therefore, how to effectively integrate the manufacturing processes of memory cells and components in other regions is a very important issue for related industries.

SUMMARY OF THE INVENTION

A semiconductor device and a manufacturing method thereof are provided in the present invention for improving an electrically connection between a contact structure and a stacked structure, and manufacturing yield of the semiconductor device may be enhanced accordingly.

According to an embodiment of the present invention, a semiconductor device is provided. The semiconductor device includes a semiconductor substrate, a first stacked structure, and a contact structure. The semiconductor substrate has a cell region and a peripheral region, and the semiconductor substrate includes at least one fin-shaped structure isolated by an insulation structure. The first stacked structure is disposed in the semiconductor substrate. The first stacked structure is disposed straddling the at least one fin-shaped structure, extends in a horizontal direction, and is disposed in the cell region and the peripheral region. The first stacked structure includes an electrically conductive layer, a capping layer, and a dielectric capping layer. The electrically conductive layer includes a first portion and a second portion. The first portion is located in the cell region, and the second portion is located in the peripheral region. The capping layer is disposed on the electrically conductive layer. The dielectric capping layer is disposed on the capping layer and the electrically conductive layer. The dielectric capping layer contacts a top surface of the second portion of the electrically conductive layer. The contact structure directly contacts the electrically conductive layer and is electrically connected with the first stacked structure.

According to an embodiment of the present invention, a manufacturing method of a semiconductor device is provided. The manufacturing method includes the following steps. A semiconductor substrate is provided. The semiconductor structure has a cell region and a peripheral region, and the semiconductor substrate includes at least one fin-shaped structure isolated by an insulation structure. A first stacked structure is formed in the semiconductor substrate. The first stacked structure is formed straddling the at least one fin-shaped structure, extends in a horizontal direction, and is formed in the cell region and the peripheral region. The first stacked structure includes an electrically conductive layer, a capping layer, and a dielectric capping layer. The electrically conductive layer includes a first portion and a second portion. The first portion is located in the cell region, and the second portion is located in the peripheral region. The capping layer is disposed on the electrically conductive layer. The dielectric capping layer is disposed on the capping layer and the electrically conductive layer. The dielectric capping layer contacts a top surface of the second portion of the electrically conductive layer. A contact structure is subsequently formed. The contact structure directly contacts the electrically conductive layer and is electrically connected with the first stacked structure.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are directed to provide a better understanding of the embodiments and are included as parts of the specification of the present disclosure. These drawings and descriptions are used to illustrate the principles of the embodiments. It should be noted that all drawings are schematic, and the relative dimensions and scales have been adjusted for the convenience of drawing. Identical or similar features in different embodiments are marked with identical symbols.

FIGS. 3-10 are schematic drawings illustrating a manufacturing method of a semiconductor device according to an embodiment of the present invention, wherein FIG. 4 is a schematic drawing in a step subsequent to FIG. 3, FIG. 5 is a schematic drawing in a step subsequent to FIG. 4, FIG. 6 is a schematic drawing in a step subsequent to FIG. 5, FIG. 7 is a schematic drawing in a step subsequent to FIG. 6, FIG. 8 is a schematic drawing in a step subsequent to FIG. 7, FIG. 9 is a schematic drawing in a step subsequent to FIG. 8, and FIG. 10 is another cross-sectional schematic drawing illustrating the condition of FIG. 9.

DETAILED DESCRIPTION

To provide a better understanding of the presented invention for those skilled in the technical field of the present invention, several preferred embodiments of the present invention are enumerated below, together with the accompanying drawings, to describe the technical solutions and desired effects of the present invention in detail. Those skilled in the art may refer to the following embodiments and replace, reorganize, and mix features in several different embodiments to complete other embodiments without departing from the spirit of the present invention The term "forming" or the term "disposing" are used hereinafter to describe the behavior of applying a layer of material to the substrate. Such terms are intended to describe any possible layer forming techniques including, but not limited to, thermal growth, sputtering, evaporation, chemical vapor deposition, epitaxial growth, electroplating, and the like.

Figure 1:
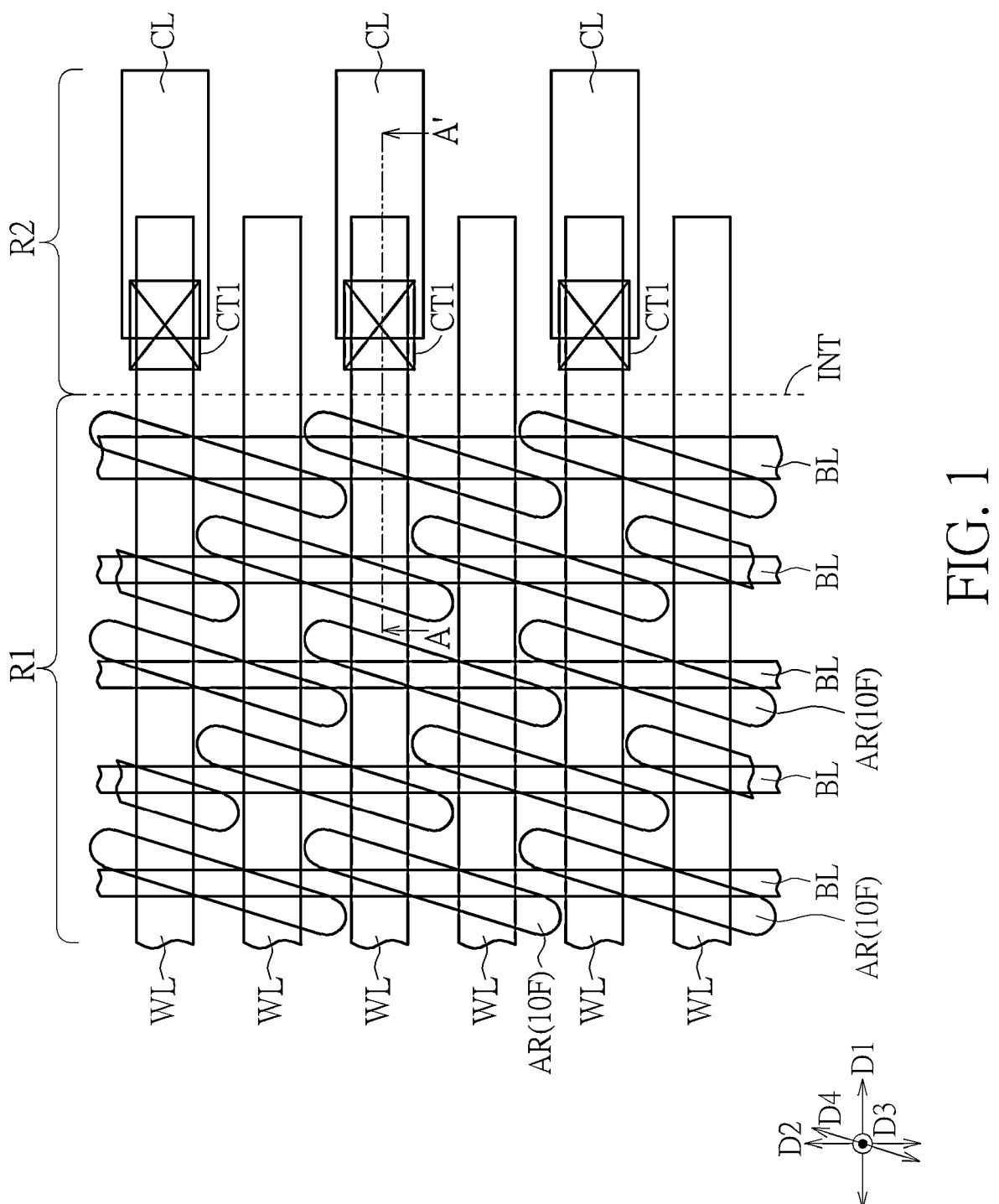
FIG. 1 is a top view schematic drawing illustrating a semiconductor device according to an embodiment of the present invention.
Figure 2:
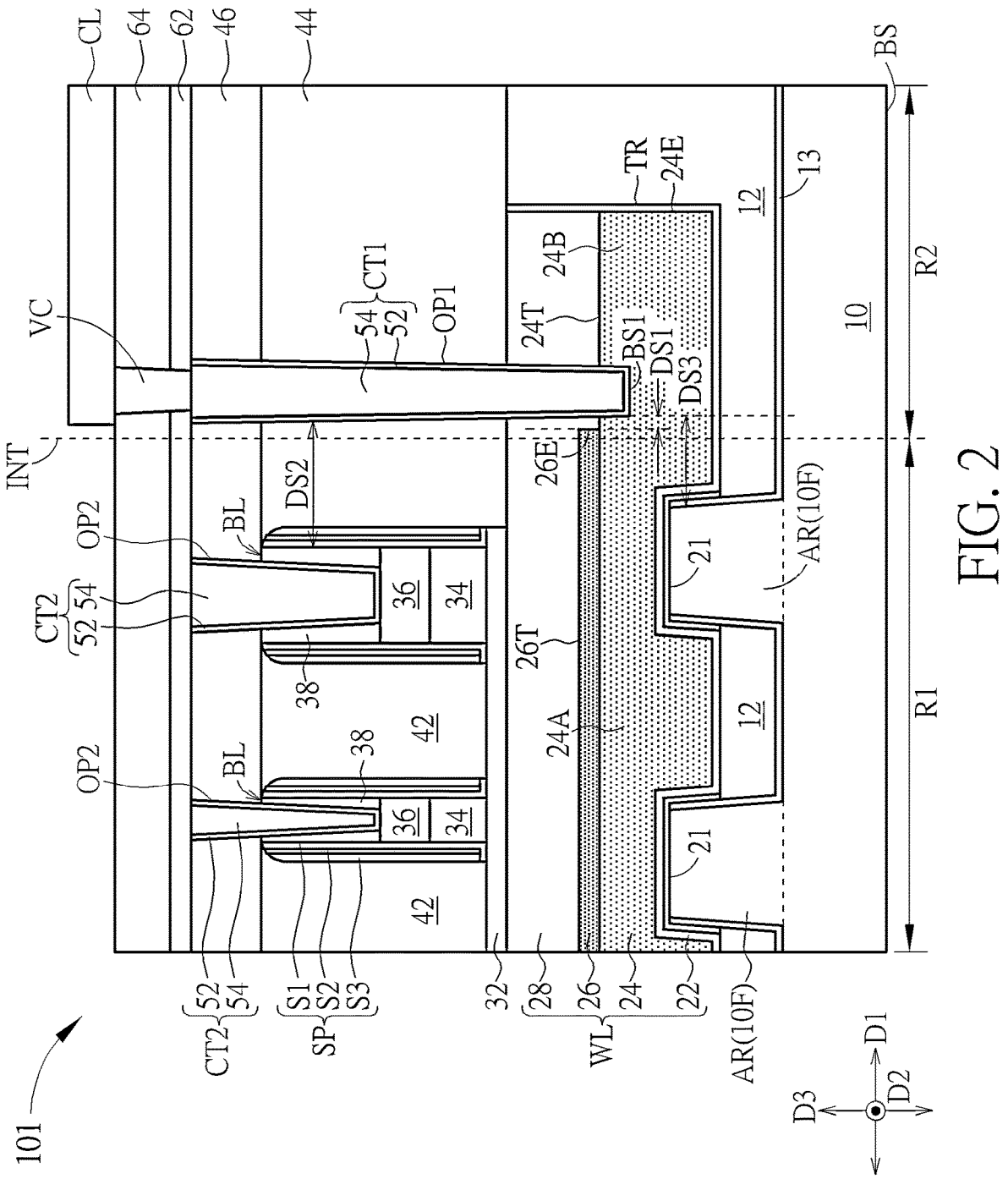
FIG. 2 is a cross-sectional schematic drawing illustrating a semiconductor device according to a first embodiment of the present invention.

Please refer to FIG. 1 and FIG. 2. FIG. 1 is a top view schematic drawing illustrating a semiconductor device according to an embodiment of the present invention, and FIG. 2 is a cross-sectional schematic drawing illustrating a semiconductor device according to a first embodiment of the present invention. In some embodiments, at least a portion of FIG. 2 may be regarded as a cross-sectional diagram taken along a line A-A' in FIG. 1, but not limited thereto. As shown in FIG. 1 and FIG. 2, a semiconductor device 101 includes a semiconductor substrate 10, a first stacked structure WL, and a contact structure CT1. The semiconductor substrate 10 has a cell region R1 and a peripheral region R2, and the semiconductor substrate 10 includes at least one fin-shaped structure 10F isolated by an insulation structure 12. The first stacked structure WL is disposed in the semiconductor substrate 10. The first stacked structure WL is disposed straddling the fin-shaped structure 10F, extends in a horizontal direction D1, and disposed in the cell region R1 and the peripheral region R2. The first stacked structure WL includes an electrically conductive layer 24, a capping layer 26, and a dielectric capping layer 28. The electrically conductive layer 24 includes a first portion 24A and a second portion 24B. The first portion 24A is located in the cell region R1, and the second portion 24B is located in the peripheral region R2. The capping layer 26 is disposed on the electrically conductive layer 24. The dielectric capping layer 28 is disposed on the capping layer 26 and the electrically conductive layer 24. The dielectric capping layer 28 contacts a top surface 24T of the second portion 24B of the electrically conductive layer 24. The contact structure CT1 directly contacts the electrically conductive layer 24 and is electrically connected with the first stacked structure WL. The negative influence of the capping layer 26 on the manufacturing process of the contact structure CT1 may be avoided and/or reduced by the relative disposition of the electrically conductive layer 24, the capping layer 26, and the dielectric capping layer 28 in the first stacked structure WL described above. The electrical connection between the contact structure CT1 and the first stacked structure WL may be improved accordingly, and the manufacturing yield of the semiconductor device may be enhanced.

In some embodiments, the semiconductor substrate 10 may include a silicon substrate, a silicon germanium semiconductor substrate, a silicon-on-insulator (SOI) substrate, or a substrate made of other suitable materials. The semiconductor substrate 10 may have a top surface and a bottom surface BS opposite to the top surface in a vertical direction D3 substantially orthogonal to the horizontal direction D1, and the vertical direction D3 may be regarded as a thickness direction of the semiconductor substrate 10, but not limited thereto. In this description, a distance between the bottom surface BS of the semiconductor substrate 10 and a relatively higher location and/or a relatively higher part in the vertical direction D3 may be greater than a distance between the bottom surface BS of the semiconductor substrate 10 and a relatively lower location and/or a relatively lower part in the vertical direction D3. The bottom or a lower portion of each component may be closer to the bottom surface BS of the semiconductor substrate 10 in the vertical direction D3 than the top or upper portion of this component. Another component disposed above a specific component may be regarded as being relatively far from the bottom surface BS of the semiconductor substrate 10 in the vertical direction D3, and another component disposed under a specific component may be regarded as being relatively close to the bottom surface BS of the semiconductor substrate 10 in the vertical direction D3. Additionally, in this description a top surface of a specific component may include the topmost surface of this component in the vertical direction D3, and a bottom surface of a specific component may include the bottommost surface of this component in the vertical direction D3, but not limited thereto.

In some embodiments, the semiconductor device 101 may include the insulation structure 12 disposed in the semiconductor substrate 10, and the semiconductor substrate 10 may include a plurality of fin-shaped structures 10F isolated from one another by the insulation structure 12. Each of the fin-shaped structures 10F may extend in a horizontal direction D4, and at least a portion of each of the fin-shaped structures 10F may be regarded as an active region AR, but not limited thereto. In some embodiments, the fin-shaped structures 10F may be formed by performing a patterning process to the semiconductor substrate 10, the fin-shaped structure 10F may include the semiconductor material of the semiconductor substrate 10 (such as silicon, but not limited thereto) accordingly, and the fin-shaped structures 10F may be separated from one another by the insulation structure 12. The insulation structure 12 may include a single layer or multiple layers of insulation materials, such as an oxide insulation material, a nitride insulation material, or other suitable insulation materials. In some embodiments, the semiconductor device 101 may further include a stress material layer 12 and an oxide layer 21, the stress material layer 13 may be disposed between the insulation structure 12 and the semiconductor substrate 10, and the oxide layer 21 may be partly disposed between the first stacked structure WL and the fin-shaped structure 10F and partly disposed between the first stacked structure WL and the stress material layer 13. The stress material layer 13 may include a germanium-containing layer capable of providing required stress and having a better lattice structure, such as a germanium material layer and/or a silicon germanium material layer, but not limited thereto. For example, the stress material layer 13 may include silicon germanium or germanium, the semiconductor substrate 10 and the fin-shaped structure 10F may include silicon, and the lattice structure of the semiconductor substrate 10 and the fin-shaped structure 10F may be improved accordingly. In some embodiments, the stress material layer 13 may include other materials capable of providing required stress and improving the lattice structure, such as carbide, silicon carbide, and so forth. The oxide layer 21 disposed between the first stacked structure WL and the fin-shaped structure 10F may include an element identical to that in the material of the fin-shaped structure 10F, and the oxide layer 21 disposed between the first stacked structure WL and the fin-shaped structure 10F may include silicon oxide for example, but not limited thereto. The oxide layer 21 disposed between the first stacked structure WL and the stress material layer 13 may include an element identical to that in the material of the stress material layer 13, and the oxide layer 21 disposed between the first stacked structure WL and the stress material layer 13 may include silicon germanium oxide or germanium oxide for example, but not limited thereto.

In some embodiments, the semiconductor device 101 may include a plurality of the first stacked structures WL, each of the first stacked structures WL may extend in the horizontal direction D1, and the first stacked structures WL may be arranged repeatedly in a horizontal direction D2 substantially orthogonal to the horizontal direction D1, but not limited thereto. Each of the first stacked structures WL may be disposed in a trench TR located in the semiconductor substrate 10, and each of the first stacked structures WL may extend in the horizontal direction D1 for being disposed straddling the fin-shaped structures 10F. Additionally, in some embodiments, the first stacked structure WL may further include a dielectric layer 22 located in the trench TR, and the dielectric layer 22 may be partly disposed between the electrically conductive layer 24 and the fin-shaped structure 10F and partly disposed between the electrically conductive layer 24 and the insulation structure 12, such as being disposed between a sidewall 24E of the electrically conductive layer 24 and the insulation structure 12 in the horizontal direction D1, but not limited thereto. The dielectric layer 22 may include a high dielectric constant (high-k) dielectric material or other suitable dielectric materials. The high-k dielectric material described above may include hafnium oxide ($HfO_x$), hafnium silicon oxide ($HfSiO_4$), hafnium silicon oxynitride (HfSiON), aluminum oxide ($Al_2O_3$), tantalum oxide ($Ta_2O_5$), zirconium oxide ($ZrO_2$), or other suitable high-k dielectric materials. The electrically conductive layer 24 may include a single layer or multiple layers of electrically conductive materials, such as titanium nitride, titanium carbide, tantalum nitride, tantalum carbide, tungsten nitride, tungsten carbide, titanium aluminide, aluminum nitride, titanium, tungsten, aluminum, copper, tantalum, or other suitable metallic or nonmetallic electrically conductive materials. The capping layer 26 may include doped polycrystalline silicon, undoped polycrystalline silicon, or other materials different from the electrically conductive layer 24 and the dielectric capping layer 28. The dielectric capping layer 28 may include silicon nitride, silicon oxide, silicon oxynitride, a combination of the materials described above, or other suitable dielectric materials.

In some embodiments, at least a part of the top surface 24T of the second portion 24B of the electrically conductive layer 24 is not covered by the capping layer 26, and the dielectric capping layer 28 may partly cover and directly contact the top surface 24T of the second portion 24B of the electrically conductive layer 24 and a top surface 26T of the capping layer 26. In some embodiments, a sidewall 26E of the capping layer 26 may face the contact structure CT1 in the horizontal direction D1, the sidewall 26E of the capping layer 26 may be separated from the contact structure CT1, and a part of the dielectric capping layer 28 may be located between the sidewall 26E of the capping layer 26 and the contact structure CT1 in the horizontal direction D1. In some embodiments, the capping layer 26 may be partly disposed in the cell region R1 and partly disposed in the peripheral region R2, and the sidewall 26E of the capping layer 26 facing the contact structure CT1 may be located in the peripheral regionR2. Therefore, the capping layer 26 may be partly located on the first portion 24A of the electrically conductive layer 24 and partly located on the second portion 24B of the electrically conductive layer 24, and the sidewall 26E of the capping layer 26 may be located above the second portion 24B of the electrically conductive layer 24. A distance DS1 may be defined as a distance between the sidewall 26E of the capping layer 26 and the contact structure CT1 in the horizontal direction D1, and a distance DS3 may be defined as a distance between the contact structure CT1 and the fin-shaped structure 10F adjacent to the contact structure CT1 in the horizontal direction D1. In some embodiments, the distance DS1 may be less than the distance DS3, but not limited thereto. Additionally, in some embodiments, the contact structure CT1 may extend downwards in the vertical direction D3 for being partly located in the electrically conductive layer 24, and a bottom surface BSI of the contact structure CT1 may be lower than the top surface 24T of the electrically conductive layer 24 in the vertical direction D3 accordingly.

In some embodiments, the semiconductor device 101 may further include a plurality of second stacked structures BL and a plurality of insulation patterns 42 disposed above the cell region R1 of the semiconductor substrate 10. Each of the second stacked structures BL may extend in the horizontal direction D2, the second stacked structures BL may be arranged repeatedly in the horizontal direction D1, and each of the insulation patterns 42 may be located between the second stacked structures BL adjacent to each other. In addition, one of the second stacked structures BL may be disposed adjacent to an interface between the cell region R1 and the peripheral region R2 (such as an interface INT), and a width of this second stacked structure BL may be greater than a width of each of the other second stacked structures BL, but not limited thereto. Each of the second stacked structures BL may partially overlap the first stacked structures WL in the vertical direction D3, and each of the second stacked structures BL may include an electrically conductive layer 34, an electrically conductive layer 36, and a capping layer 38 stacked in the vertical direction D3. In some embodiments, the electrically conductive layer 34 may include a nonmetallic electrically conductive material (such as doped polycrystalline silicon or other suitable or other suitable nonmetallic electrically conductive materials), the electrically conductive layer 36 may include a metallic electrically conductive material (such as tungsten, titanium, or other suitable metallic electrically conductive materials), and the capping layer 38 may include a nitride insulation material, an oxynitride insulation material, or other suitable insulation materials. In addition, the insulation pattern 42 may include a nitride insulation material or other suitable insulation materials. In some embodiments, the first stacked structure WL may be a word line structure (such as a buried word line structure), the second stacked structure BL may be a bit line structure, and the semiconductor device 101 may be a memory device, but not limited thereto. In addition, a distance DS2 may be defined as a distance between the contact structure CT1 and the second stacked structure BL disposed adjacent to the interface INT in the horizontal direction D1. In some embodiments, the distance DS1 defined above may be less than the distance DS2 because the sidewall 26E of the capping layer 26 facing the contact structure CT1 is located in the peripheral region R2, but not limited thereto.

In some embodiments, the semiconductor device 101 may further include a mask layer 32. The mask layer 32 is disposed on the first stacked structure WL, a part of each of the second stacked structures BL may be disposed on the mask layer 32, and the mask layer 32 may include silicon nitride, silicon oxide, silicon oxynitride, a combination of the materials described above, or other suitable mask materials. In addition, the semiconductor device 101 may further include a plurality of sidewall structures SP disposed on sidewalls of corresponding second stacked structures BL, respectively, and each of the sidewall structures SP may include a multi-layer structure made of different insulation materials, but not limited thereto. For example, the sidewall structure SP may include a sidewall spacer S1, a sidewall spacer S2, and a sidewall spacer S3 sequentially stacked from the sidewall of the second stacked structure BL outwards in the horizontal direction D1, and the sidewall spacer S1, the sidewall spacer S2, and the sidewall spacer S3 may be a nitride insulation material, an oxide insulation material, and a nitride insulation material, respectively, or other combinations of the materials described above, but not limited thereto.

In some embodiments, the semiconductor device 101 may further include a dielectric layer 44, a dielectric layer 46, and contact structures CT2. The dielectric layer 44 may be disposed on the cell region R1 and the peripheral region R2 of the semiconductor substrate 10 and cover the first stacked structure WL, and the dielectric layer 46 may be disposed on the dielectric layer 44, the second stacked structures BL, and the insulation patterns 42. In some embodiments, the contact structure CT1 may penetrate through the dielectric layer 46, the dielectric layer 44, and the dielectric capping layer 28 in the vertical direction D3 for contacting and being electrically connected with the electrically conductive layer 24 in the first stacked structure WL, and the contact structure CT2 may penetrate through the dielectric layer 46 and the capping layer 38 in the vertical direction D3 for contacting and being electrically connected with electrically conductive layer 36 in the corresponding second stacked structure BL. In addition, the contact structure CT1 and the contact structure CT2 may include the same material composition, such as including a barrier layer 52 and an electrically conductive layer 54 disposed on the barrier layer 52, but not limited thereto. The barrier layer 52 may include titanium nitride, tantalum nitride, or other suitable electrically conductive barrier materials, and the electrically conductive layer 54 may include copper, aluminum, tungsten, molybdenum, an alloy of the materials described above, a composite layer structure of the materials described above, or other suitable electrically conductive materials. In some embodiments, the semiconductor device 101 may further include an etching stop layer 62, a dielectric layer 64, a via conductor VC, and a conductive line CL. The etching stop layer 62 may cover the dielectric layer 46, the contact structure CT1, and the contact structures CT2. The dielectric layer 64 may be disposed on the etching stop layer 62, the conductive line CL may be disposed on the dielectric layer 64, and the via conductor VC may penetrate through the dielectric layer 64 and the etching stop layer 62 in the vertical direction D3 and electrically connect the contact structure CT1 and the conductive line CL. The etching stop layer 62 may include silicon nitride or other suitable dielectric materials, the dielectric layer 64 may include silicon oxide, silicon oxynitride, a low dielectric constant dielectric material, or other suitable dielectric materials, and the via conductor VC and the conductive line CL may include a single layer or multiple layers of electrically conductive materials, such as a barrier layer and an electrically conductive layer disposed on the barrier layer, but not limited thereto.

In some embodiments, the contact structure CT1 and other contact structures (such as the contact structure CT2 described above, but not limited thereto) may be formed concurrently by the same manufacturing process. The negative influence of the capping layer 26 on the manufacturing process of the contact structure CT1 may be avoided and/or reduced by the relative disposition of the electrically conductive layer 24, the capping layer 26, and the dielectric capping layer 28 in the first stacked structure WL in this embodiment. For example, the negative influence may include serious over etching in the step of forming openings corresponding to other contact structures because a part of the capping layer 26 has to be etched. In addition, the contact structure CT1 may directly contact the electrically conductive layer 24, and the electrical connection between the contact structure CT1 and the first stacked structure WL may be improved accordingly for enhancing and the manufacturing yield of the semiconductor device.

Figure 3:
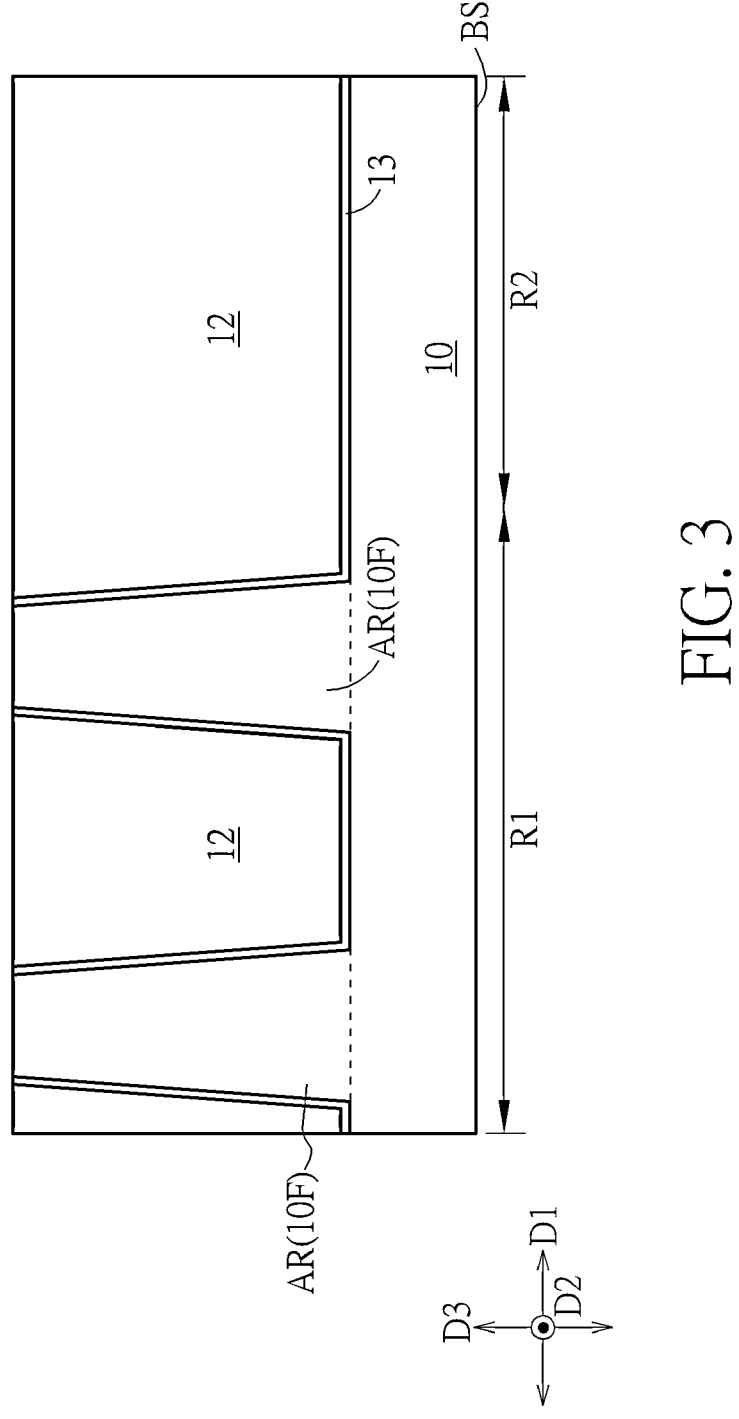
Figure 4:
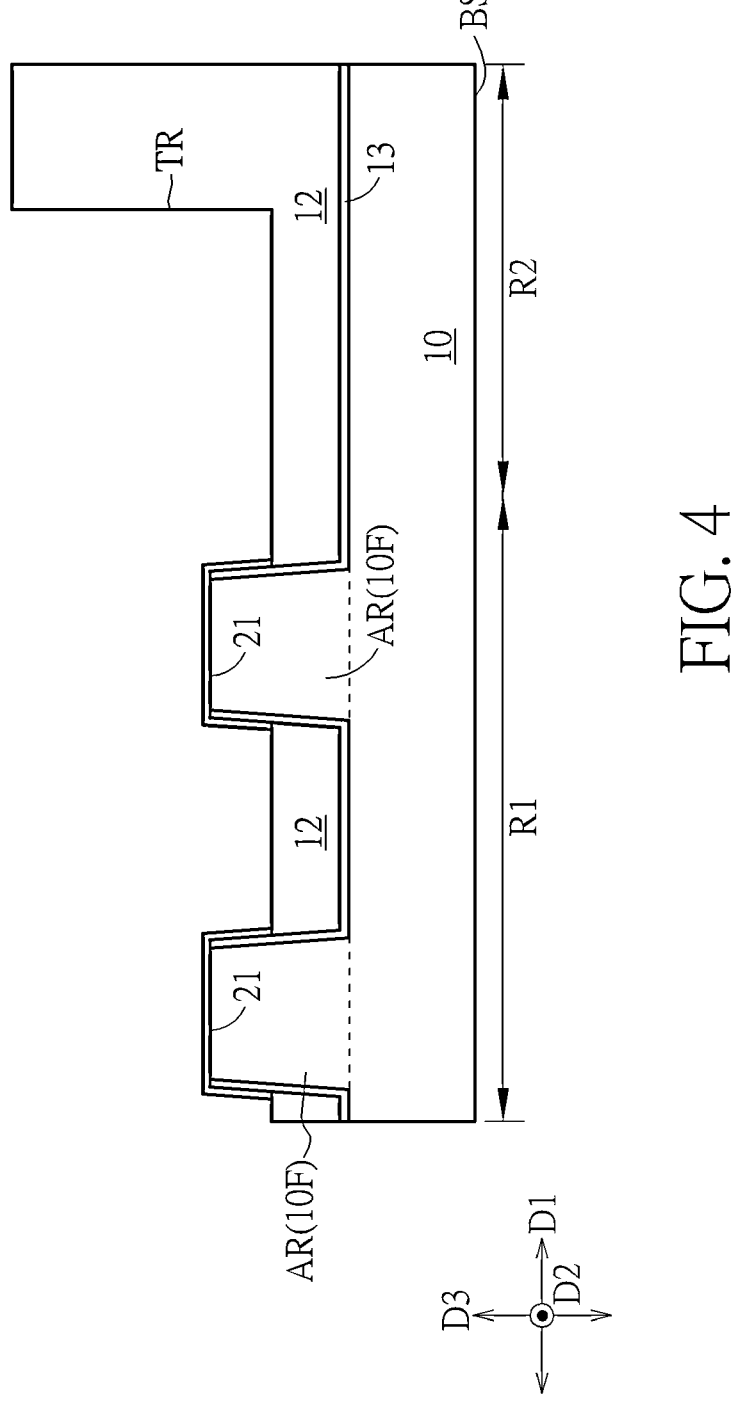
Figure 5:
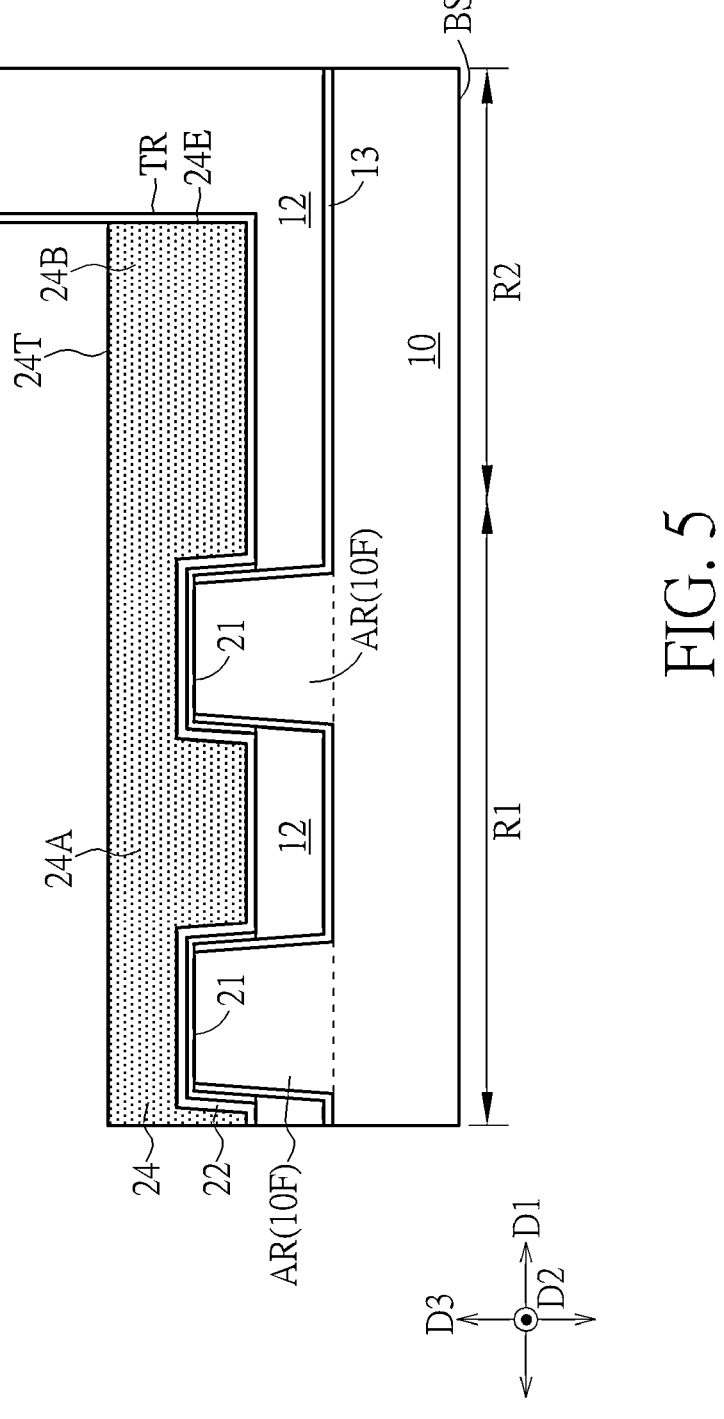
Figure 6:
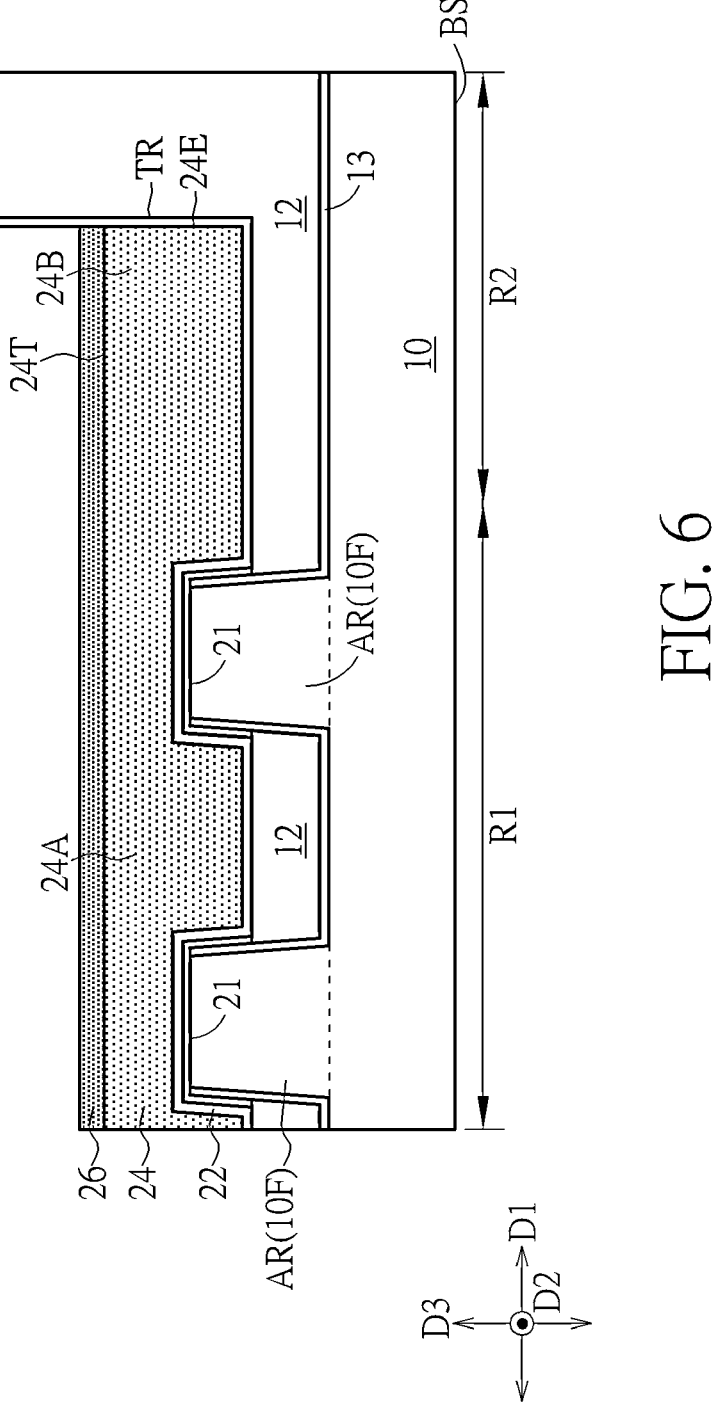
Figure 7:
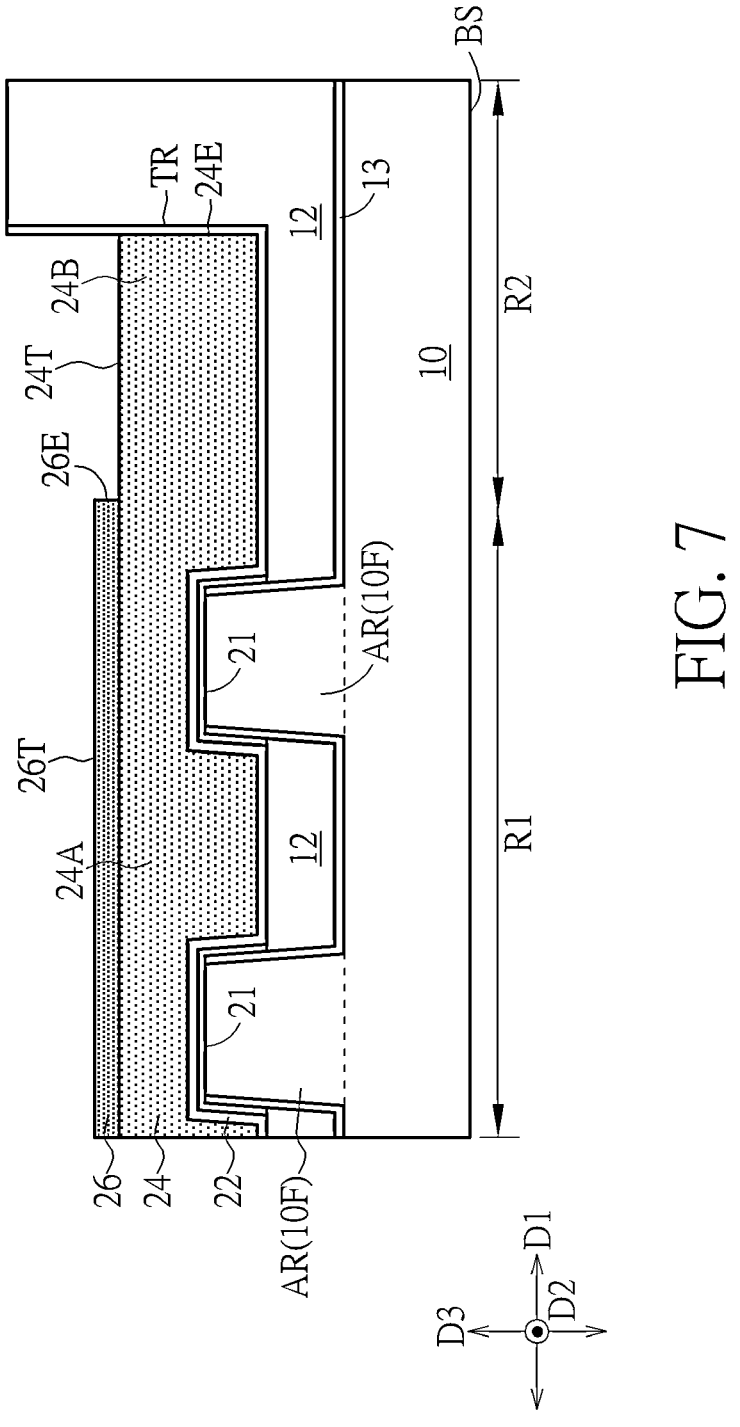
Figure 8:
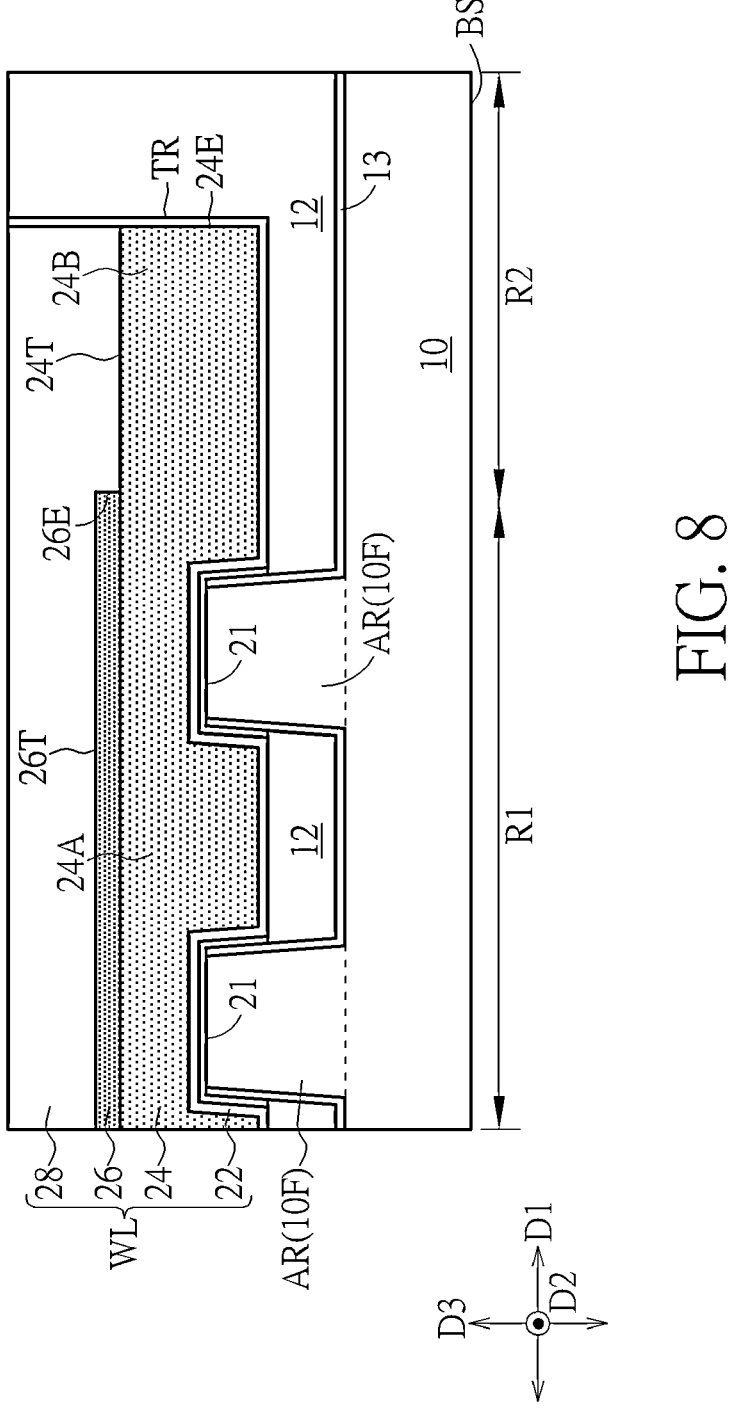
Figure 9:
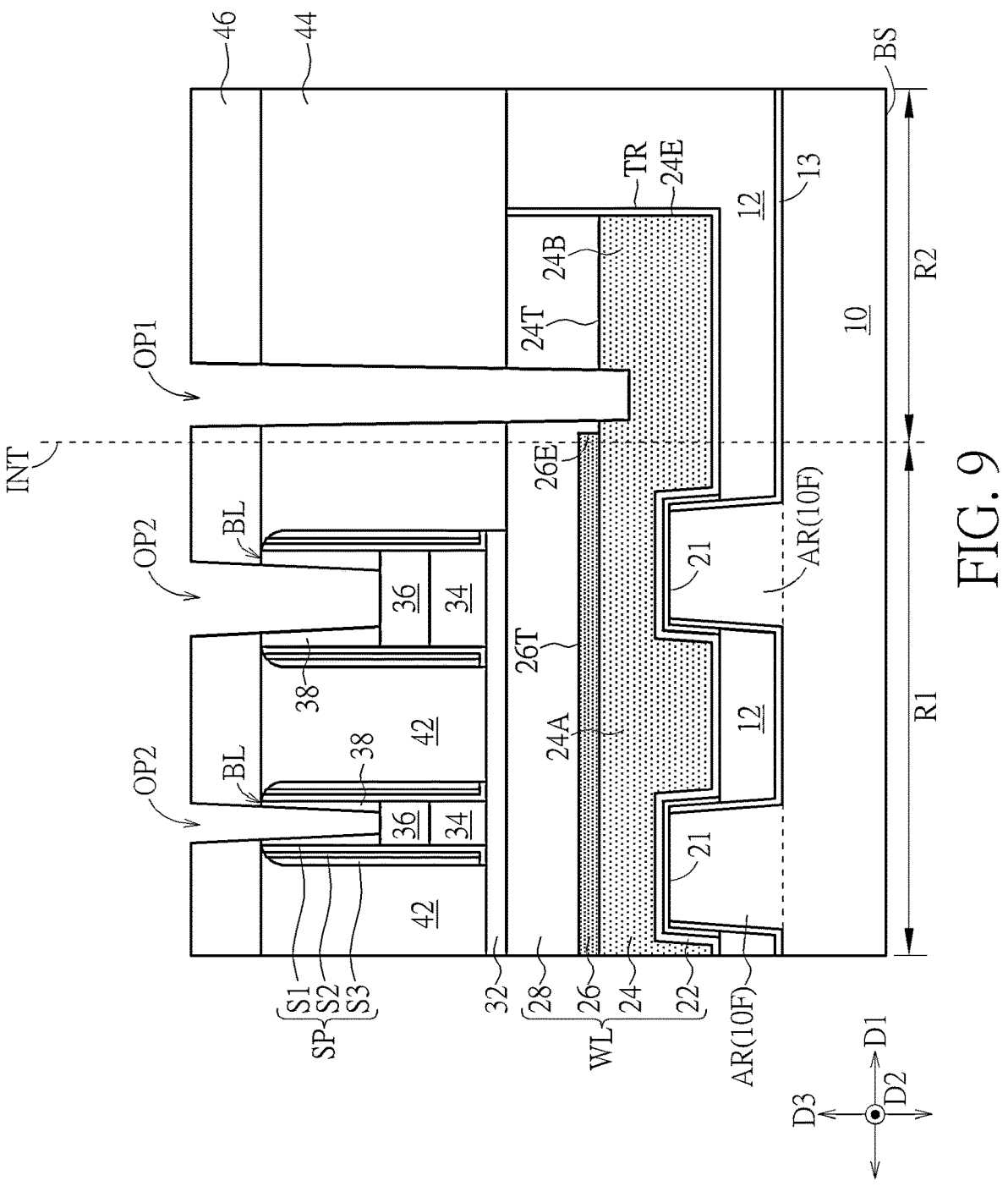
Figure 10:
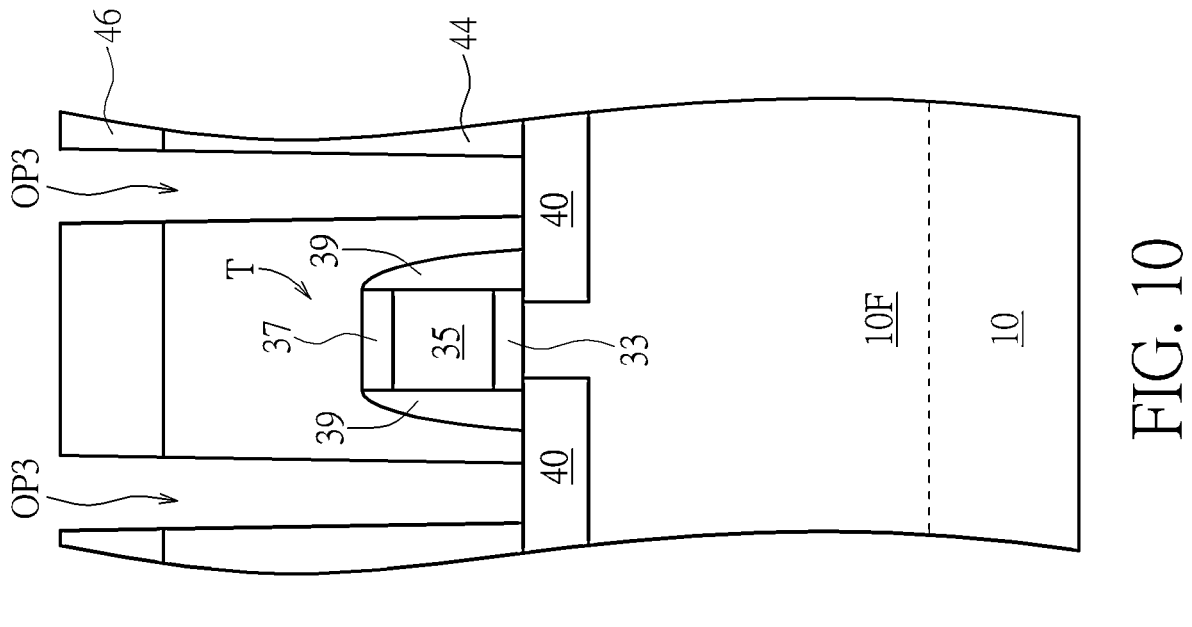

Please refer to FIGS. 1-10. FIGS. 3-10 are schematic drawings illustrating a manufacturing method of a semiconductor device according to an embodiment of the present invention, wherein FIG. 4 is a schematic drawing in a step subsequent to FIG. 3, FIG. 5 is a schematic drawing in a step subsequent to FIG. 4, FIG. 6 is a schematic drawing in a step subsequent to FIG. 5, FIG. 7 is a schematic drawing in a step subsequent to FIG. 6, FIG. 8 is a schematic drawing in a step subsequent to FIG. 7, FIG. 9 is a schematic drawing in a step subsequent to FIG. 8, and FIG. 10 is another cross-sectional schematic drawing illustrating the condition of FIG. 9. In some embodiments, FIG. 2 may be regarded as a schematic drawing in a step subsequent to FIG. 9, but not limited thereto. As shown in FIG. 1 and FIG. 2, a manufacturing method of a semiconductor device is provided in an embodiment of the present invention and includes the following steps. The semiconductor substrate 10 is provided. The semiconductor structure 10 has the cell region R1 and the peripheral region R2, and the semiconductor substrate 10 includes at least one fin-shaped structure 10F isolated by the insulation structure 12. The first stacked structure WL is formed in the semiconductor substrate 10. The first stacked structure WL is formed straddling the fin-shaped structure 10F, extends in the horizontal direction D1, and is formed in the cell region R1 and the peripheral region R2. The first stacked structure WL includes the electrically conductive layer 24, the capping layer 26, and the dielectric capping layer 28. The electrically conductive layer 24 includes the first portion 24A and the second portion 24B. The first portion 24A is located in the cell region R1, and the second portion 24B is located in the peripheral region R2. The capping layer 26 is disposed on the electrically conductive layer 24. The dielectric capping layer 28 is disposed on the capping layer 26 and the electrically conductive layer 24. The dielectric capping layer 28 contacts the top surface 24T of the second portion 24B of the electrically conductive layer 24. The contact structure CT1 is subsequently formed. The contact structure CT1 directly contacts the electrically conductive layer 24 and is electrically connected with the first stacked structure WL.

Specifically, the manufacturing method of the semiconductor device in this embodiment may include but is not limited to the following steps. As shown in FIG. 3, the fin-shaped structures 10F may be formed by performing a patterning process to the semiconductor substrate 10, and the stress material layer 13 and the insulation structure 12 may be formed after the step of forming the fin-shaped structures 10F. Subsequently, as shown in FIG. 3 and FIG. 4, the trench TR may be formed in the semiconductor substrate 10 by removing a part of the fin-shaped structure 10F (such as an upper portion of the fin-shaped structure 10F), a part of the stress material layer 13, and a part of the insulation structure 12, and the trench TR may be partly located in the cell region R1 and partly located in the peripheral region R2. In some embodiments, for forming the first stacked structure straddling the fin-shaped structures 10F and increasing the surface area of the fin-shaped structures 10F covered by the first stacked structure in the subsequent process, a portion of the fin-shaped structure 10F may protrude upwards from the bottom of the trench TR by adjusting an etching process used to form the trench TR. After the step of forming the trench TR, the exposed stress material layer 13 and the exposed fin-shaped structure 10F may be oxidized for forming the oxide layer 21. Subsequently, as shown in FIG. 5, the electrically conductive layer 24 may be formed in the trench TR, and the electrically conductive layer 24 includes the first portion 24A located in the cell region R1 and the second portion 24B located in the peripheral region R2. In some embodiments, an electrically conductive material may be formed on the semiconductor substrate 10, the trench TR may be filled with a part of the electrically conductive material, and another part of the electrically conductive material may be located outside the trench TR. A planarization process and/or an etching process may then be performed for removing the electrically conductive material located outside the trench TR and a portion of the electrically conductive material located outside in the trench TR, so as to form the electrically conductive layer 24, but not limited thereto Subsequently, as shown in FIG. 6, the capping layer 26 may be formed on the electrically conductive layer 24. In some embodiments, a material layer may be formed in the trench TR and formed outside the trench TR, and the capping layer 26 located on the electrically conductive layer 24 may be formed by removing the material layer located outside the trench TR and a portion of the material layer located in the trench TR, but not limited thereto. As shown in FIG. 6 and FIG. 7, a part of the capping layer 26 may be removed for exposing the top surface 24T of the second portion 24B of the electrically conductive layer 24. In some embodiments, the sidewall 26E of the capping layer 26 may be located above the second portion 24B of the electrically conductive layer 24 after the step of removing the part of the capping layer 26, but not limited thereto. As shown in FIG. 8, after the step of removing the part of the capping layer 26, the dielectric capping layer 28 may be formed in the trench TR, and the first stacked structure WL may be formed accordingly. It is worth noting that the method of forming the first stacked structure WL may include but is not limited to the manufacturing steps illustrated in FIGS. 3-8 described above. In some embodiments, the first stacked structure WL may be formed in the semiconductor substrate 10 by other approaches according to some design considerations.

As shown in FIG. 9, after the step of forming the first stacked structure WL, the mask layer 32, the second stacked structures BL, the sidewall structures SP, the insulation patterns 42, the dielectric layer 44, and the dielectric layer 46 described above may be formed. An opening OP1 penetrating through the dielectric layer 46, the dielectric layer 44, and the dielectric capping layer 28 and partly extending to the electrically conductive layer 24 and an opening OP2 penetrating through the dielectric layer 46 and the capping layer 38 may be formed subsequently. In the subsequent process, the contact structure located corresponding to the first stacked structure WL may be formed in the opening OP1, and the contact structure located corresponding to the second stacked structure BL may be formed in the opening OP2. In some embodiments, the opening OP1 and the opening OP2 may be formed concurrently by the same process, but not limited thereto. As shown in FIG. 9 and FIG. 10, in some embodiments, a transistor structure T may be formed on the semiconductor substrate 10, and the transistor structure T may include a gate dielectric layer 33, a gate electrode 35, a gate capping layer 37, a sidewall structure 39, and source/drain regions 40. In some embodiments, the dielectric layer 44 may further cover the transistor structure T, an opening OP3 may penetrate through the dielectric layer 46 and the dielectric layer 44 in the vertical direction D3 and exposing the source/drain region 40, and a contact structure located corresponding to the source/drain region 40 may be formed in the opening OP3 in the subsequent process. In some embodiments, the opening OP1, the opening OP2, and the opening OP3 may be formed concurrently by the same process for manufacturing process simplification, but not limited thereto. In some embodiments, the gate electrode 35 of the transistor structure T may be formed on the fin-shaped structure 10F, and the fin-shaped structure 10F located corresponding to the transistor structure T and the above-mentioned fin-shaped structure 10F located corresponding to the first stacked structure WL may extend in the same direction or extend in different directions, respectively. As shown in FIG. 9 and FIG. 2, after the step of forming the opening OP1 and the opening OP2, the contact structure CT1 and the contact structure CT2 described above may be formed, and the etching stop layer 62, the dielectric layer 64, the via conductor VC, and the conductive line CL may be formed for forming the semiconductor device 101.

The following description will detail the different embodiments of the present invention. To simplify the description, the following description will detail the dissimilarities among different embodiments and the identical features will not be redundantly described. In addition, identical components in each of the following embodiments of the present invention are marked with identical symbols for making it easier for comparing the embodiments more conveniently.

Figure 11:
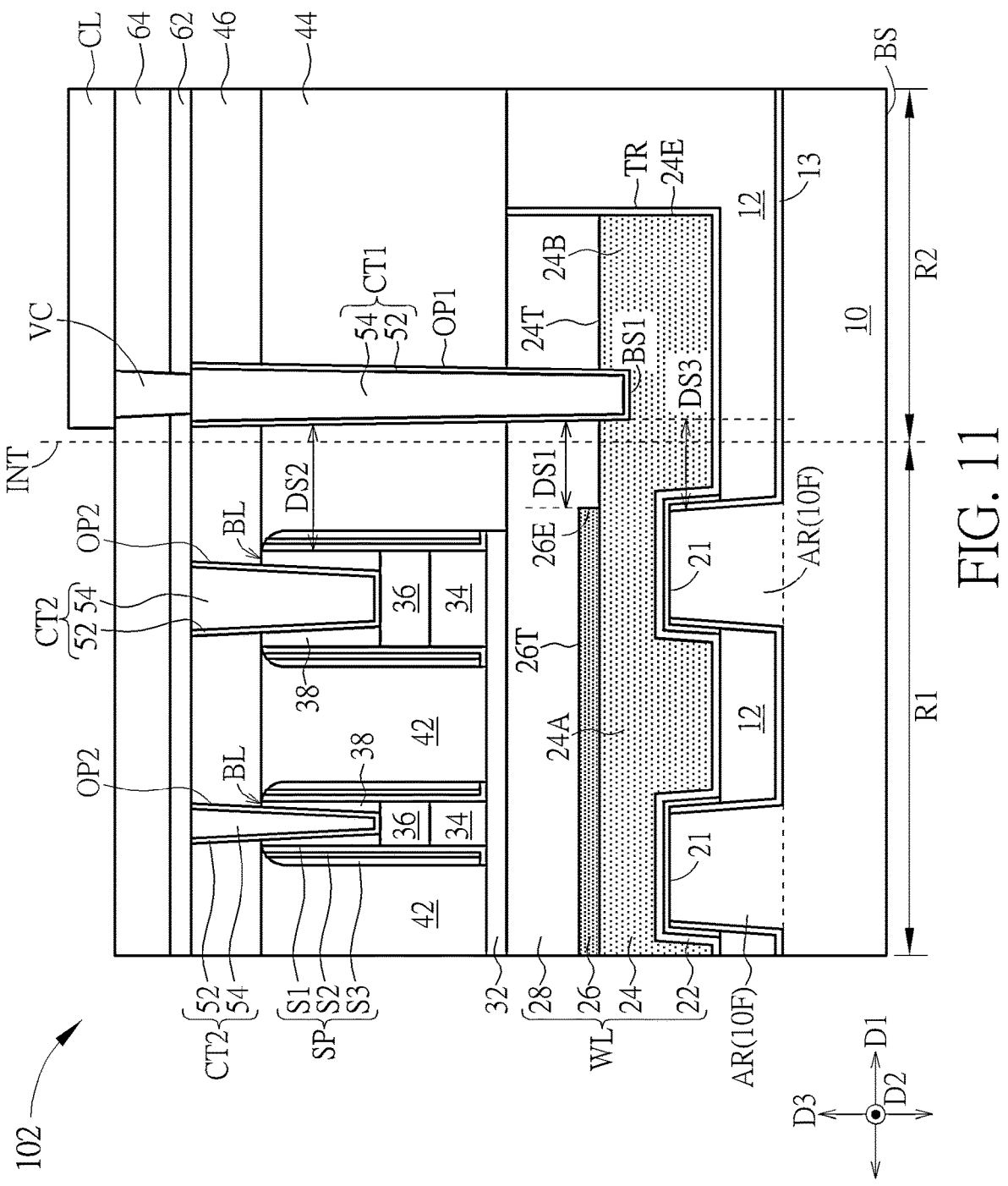
FIG. 11 is a cross-sectional schematic drawing illustrating a semiconductor device according to a second embodiment of the present invention.

Please refer to FIG. 11. FIG. 11 is a cross-sectional schematic drawing illustrating a semiconductor device 102 according to a second embodiment of the present invention. In the semiconductor device 102, the sidewall 26E of the capping layer 26 may face the contact structure CT1 in the horizontal direction D1, and the sidewall 26E may be located in the cell region R1. In this situation, the distance DS1 defined above may be less than or equal to the distance DS3 defined above, and the distance DS1 may be less than the distance DS2 defined above, but not limited thereto.

Figure 12:
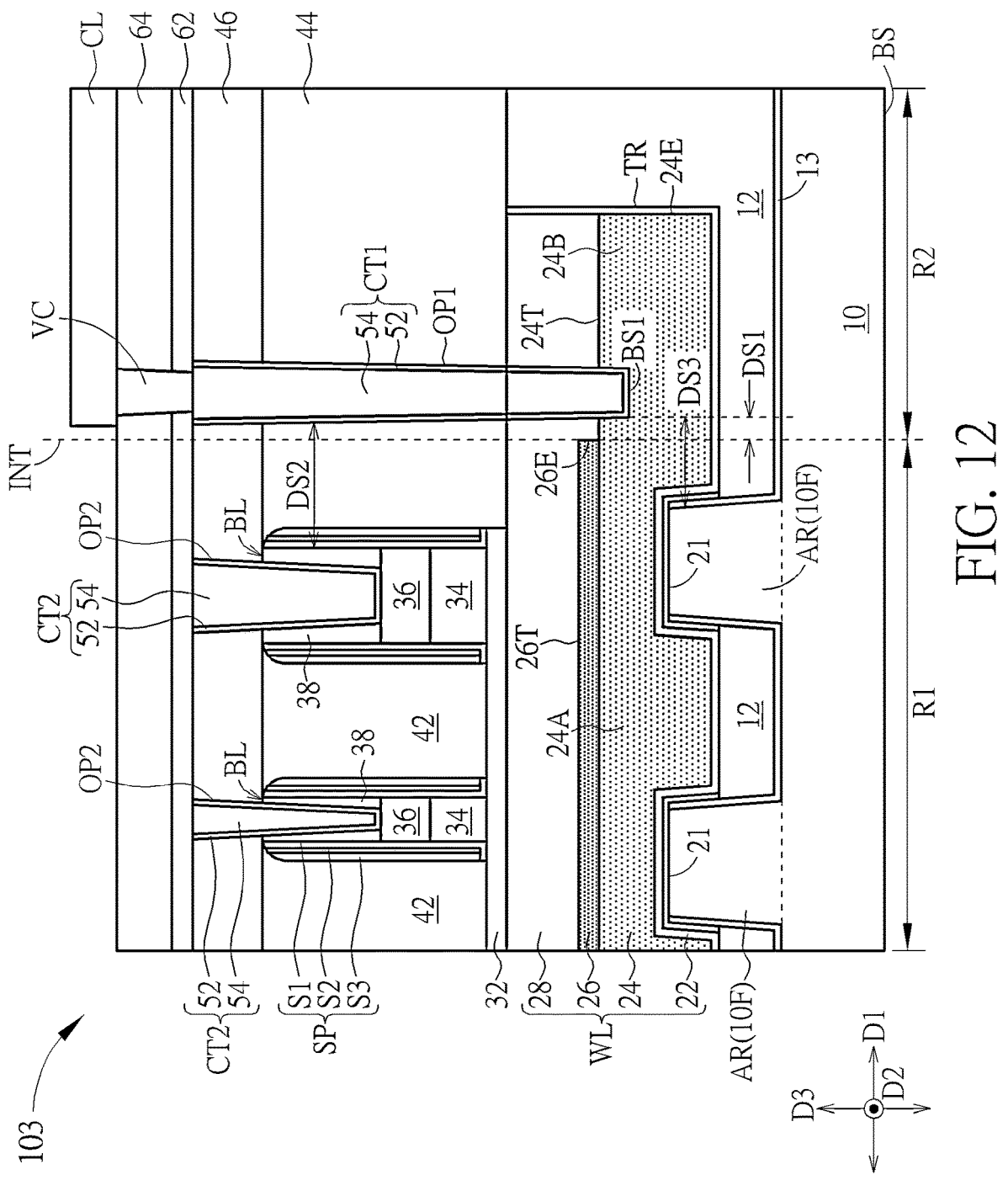
FIG. 12 is a cross-sectional schematic drawing illustrating a semiconductor device according to a third embodiment of the present invention.

Please refer to FIG. 12. FIG. 12 is a cross-sectional schematic drawing illustrating a semiconductor device 103 according to a third embodiment of the present invention. In the semiconductor device 103, the sidewall 26E of the capping layer 26 may be located at the interface between the cell region R1 and the peripheral region R2 (such as at least partially located at the interface INT). In this situation, the distance DS1 defined above may be less than the distance DS3 defined above, and the distance DS1 may be less than the distance DS2 defined above, but not limited thereto.

Figure 13:
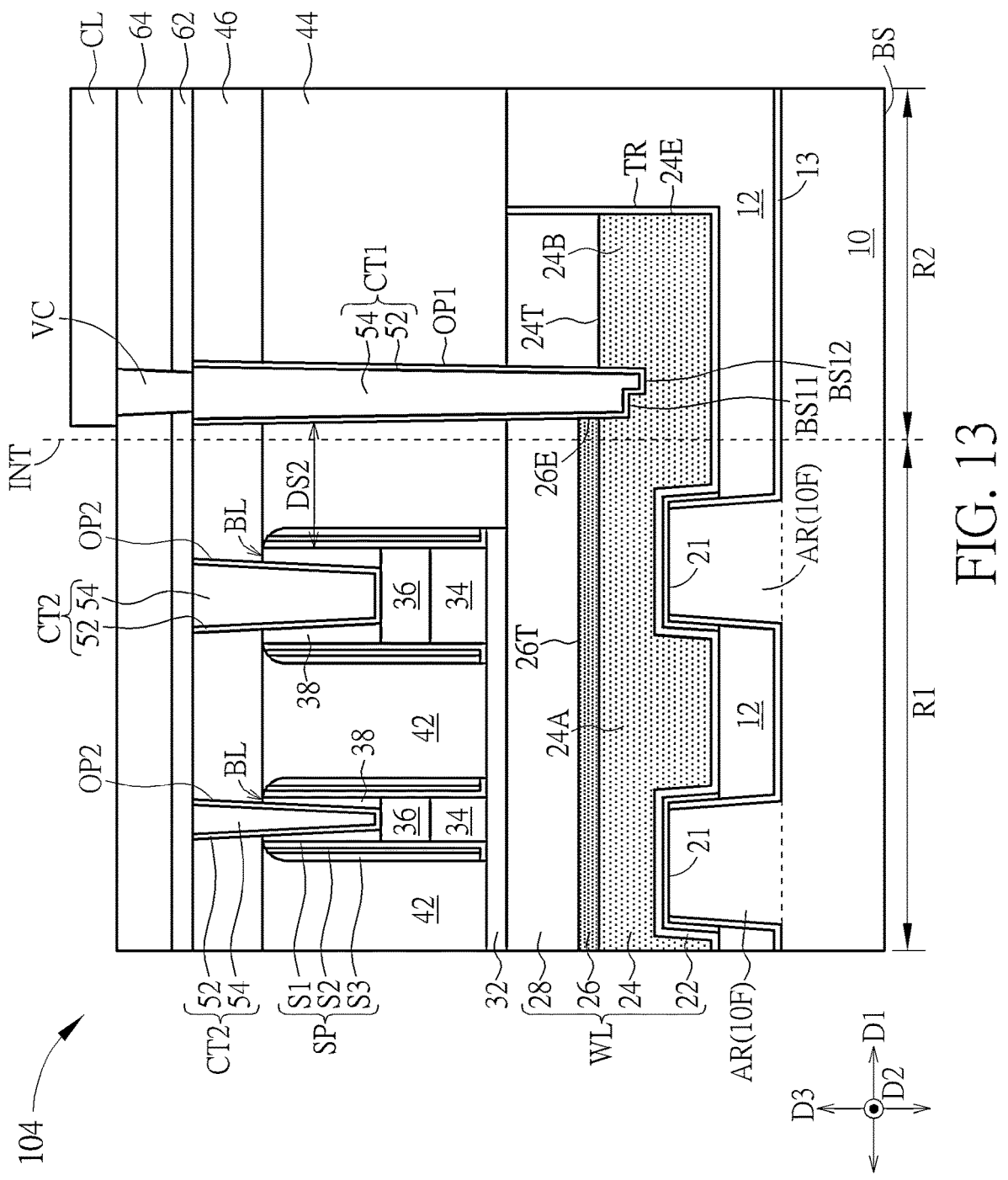
FIG. 13 is a cross-sectional schematic drawing illustrating a semiconductor device according to a fourth embodiment of the present invention.

Please refer to FIG. 13. FIG. 13 is a cross-sectional schematic drawing illustrating a semiconductor device 104 according to a fourth embodiment of the present invention. In the semiconductor device 104, the sidewall 26E of the capping layer 26 may face the contact structure CT1 in the horizontal direction D1, and the contact structure CT1 may directly contact the sidewall 26E of the capping layer 26. In some embodiments, before the step of forming the opening OP1, the position where the opening OP1 is going to be formed may overlap a part of the capping layer 26 in the vertical direction D3, the capping layer 26 has to be etched for forming the opening OP1 accordingly, and the bottom of the opening OP1 may have a ladder-shaped structure because of the influence of the capping layer 26. For example, a first bottom surface BS11 of the contact structure CT1 may be located between the capping layer 26 and a second bottom surface BS12 of the contact structure CT1 in the horizontal direction D1. The first bottom surface BS11 may be regarded as being closer to the capping layer 26 in the horizontal direction D1, the second bottom surface BS12 may be regarded as relatively far from the capping layer 26 in the horizontal direction D1, and the second bottom surface BS12 may be lower than the first bottom surface BS11 in the vertical direction D3.

Figure 14:
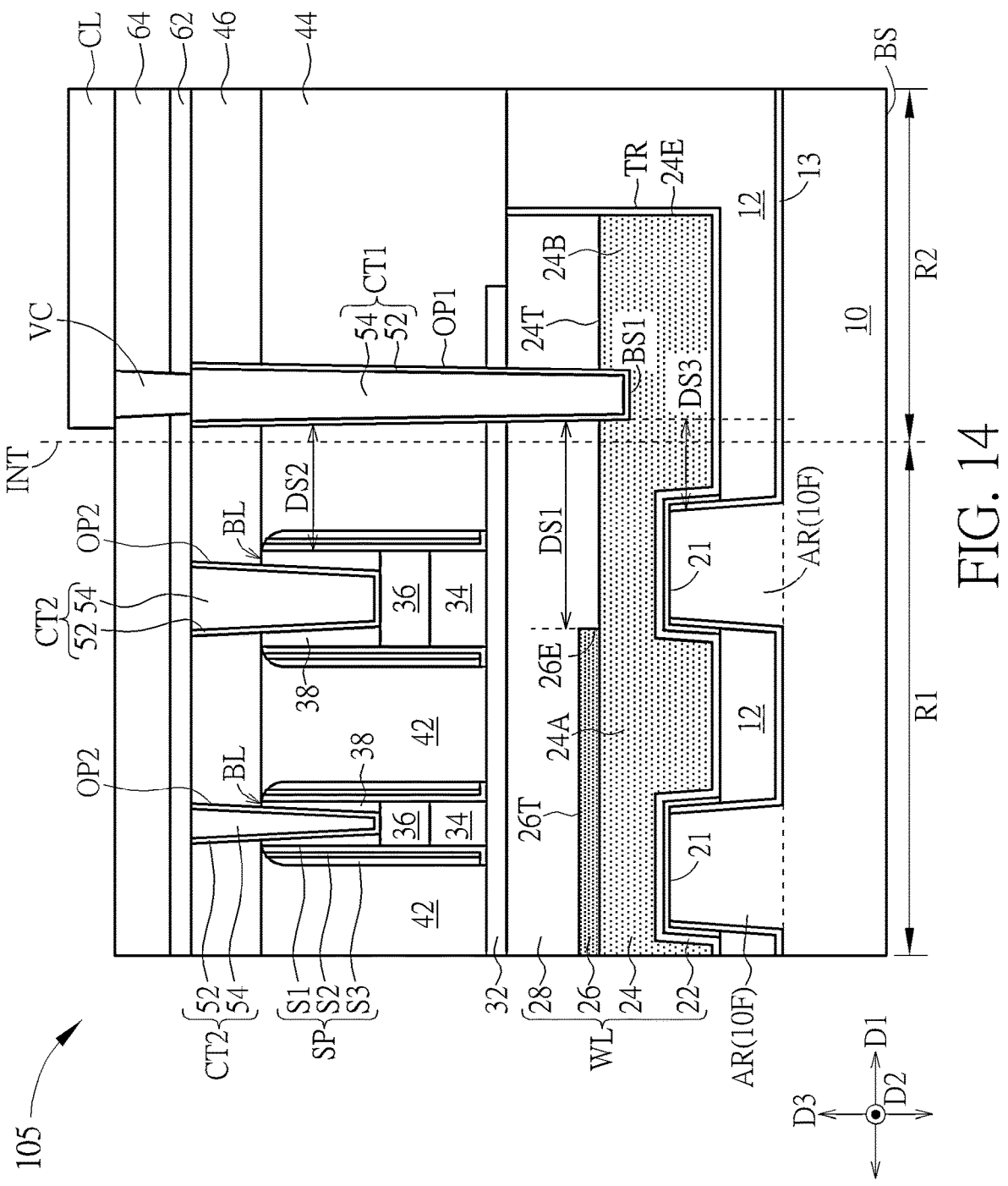
FIG. 14 is a cross-sectional schematic drawing illustrating a semiconductor device according to a fifth embodiment of the present invention.

Please refer to FIG. 14. FIG. 14 is a cross-sectional schematic drawing illustrating a semiconductor device 105 according to a fifth embodiment of the present invention. In the semiconductor device 105, the mask layer 32 may be partially located on the peripheral region R2, and the contact structure CT1 may penetrate through the dielectric layer 46, the dielectric layer 44, the mask layer 32, and the dielectric capping layer 28 for contacting and being electrically connected with the electrically conductive layer 24 in the first stacked structure WL. In addition, the sidewall 26E of the capping layer 26 may be located in the cell region R1, the distance DS1 defined above may be greater than the distance DS3 defined above, and the distance DS1 may be greater than the distance DS2 defined above, but not limited thereto.

Figure 15:
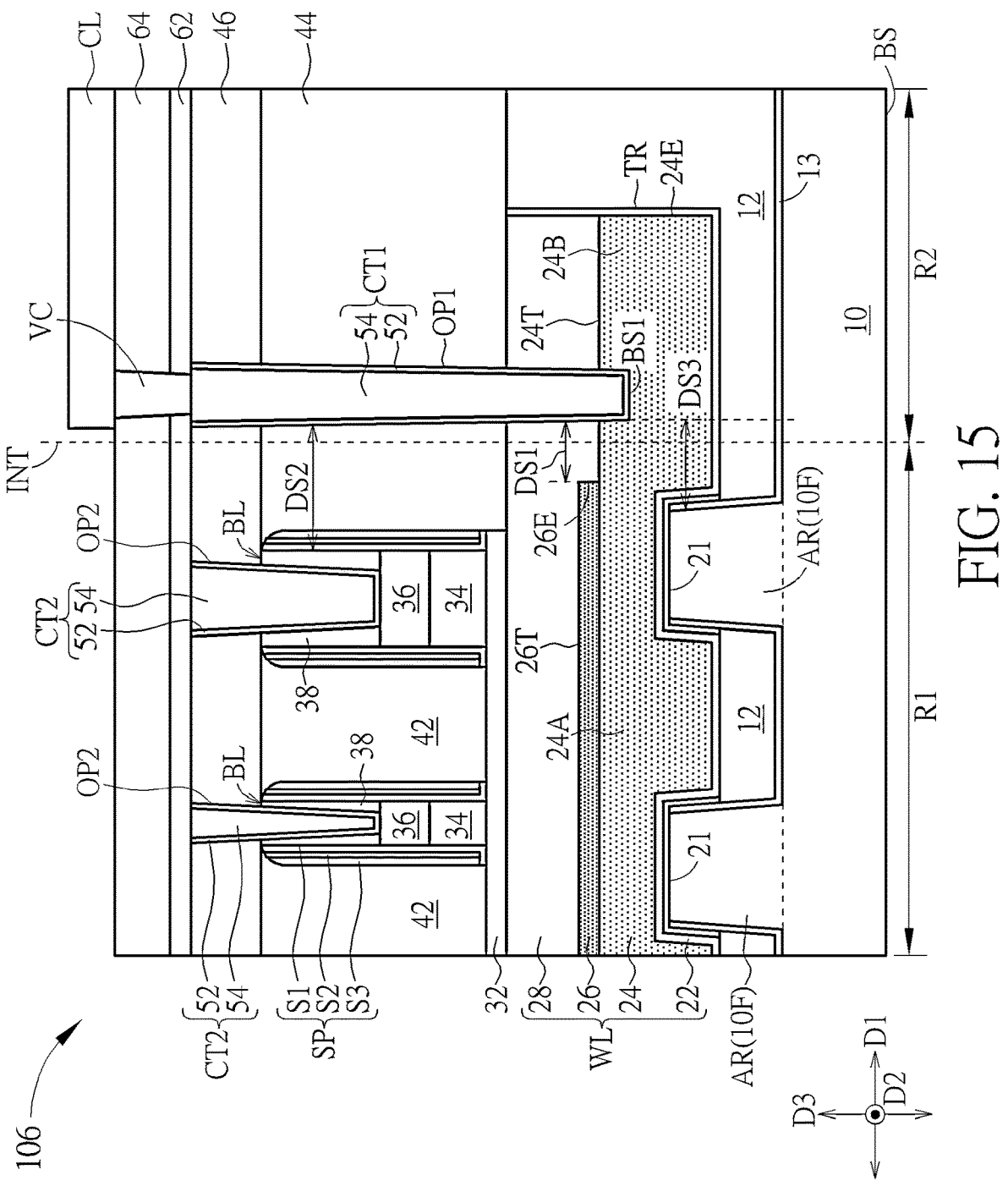
FIG. 15 is a cross-sectional schematic drawing illustrating a semiconductor device according to a sixth embodiment of the present invention.

Please refer to FIG. 15. FIG. 15 is a cross-sectional schematic drawing illustrating a semiconductor device 106 according to a sixth embodiment of the present invention. In the semiconductor device 106, the sidewall 26E of the capping layer 26 facing the contact structure CT1 in the horizontal direction D1 is located in the cell region R1 and separated from the contact structure CT1, the distance DS1 defined above may be less than the distance DS3 defined above, and the distance DS1 may be less than the distance DS2 defined above, but not limited thereto.

Figure 16:
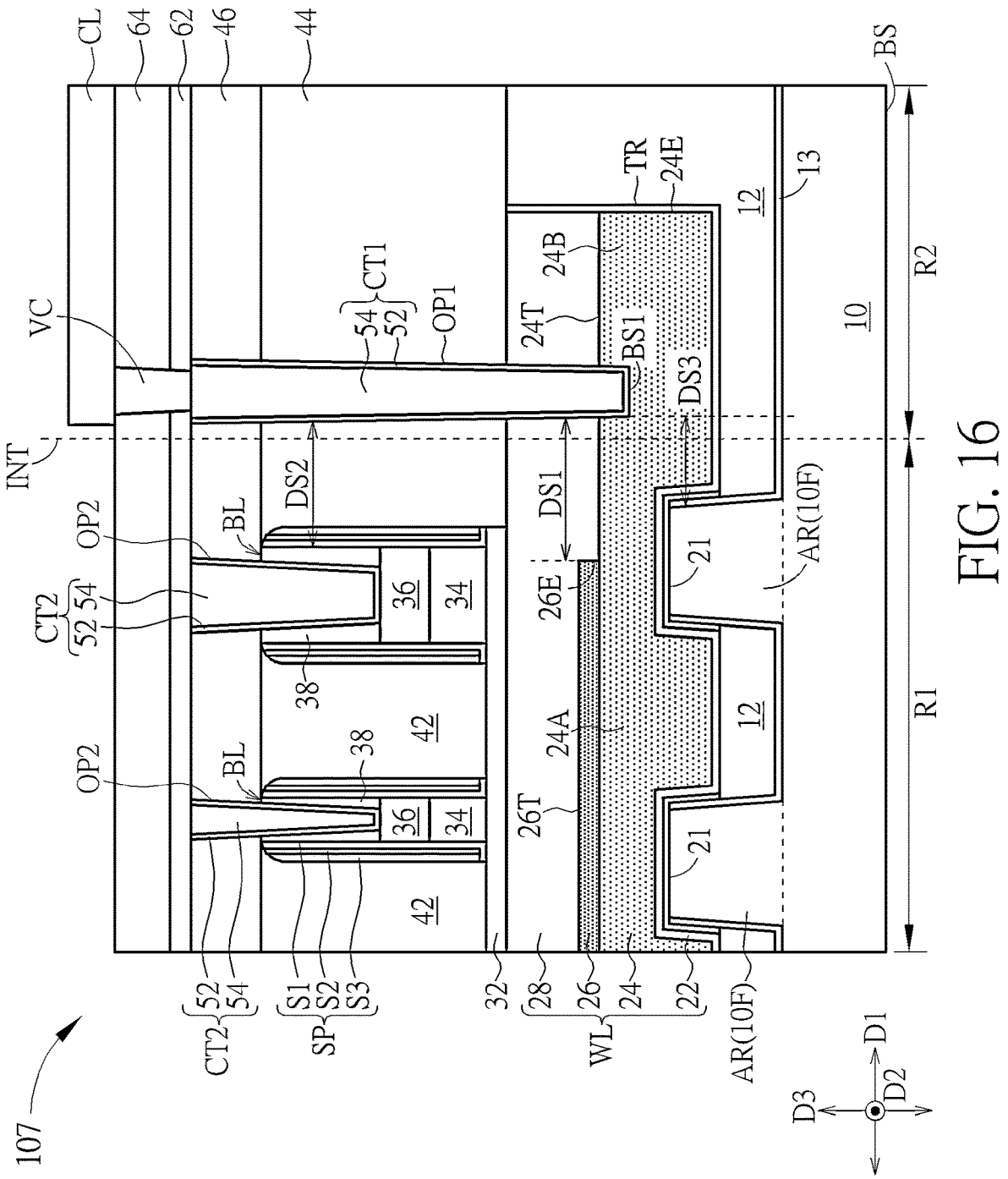
FIG. 16 is a cross-sectional schematic drawing illustrating a semiconductor device according to a seventh embodiment of the present invention.

Please refer to FIG. 16. FIG. 16 is a cross-sectional schematic drawing illustrating a semiconductor device 107 according to a seventh embodiment of the present invention. In the semiconductor device 107, the sidewall 26E of the capping layer 26 facing the contact structure CT1 in the horizontal direction D1 is located in the cell region R1 and separated from the contact structure CT1, and the sidewall 26E of the capping layer 26 may be located above one of the fin-shaped structures 10F closest to the contact structure CT1 among the fin-shaped structures 10F. The distance DS1 defined above may be greater than the distance DS3 defined above, and the distance DS1 may be greater than the distance DS2 defined above, but not limited thereto.

To summarize the above descriptions, in the semiconductor device and the manufacturing method thereof according to the present invention, the relative disposition of the electrically conductive layer and the capping layer in the first stacked structure may be adjusted for avoiding and/or reducing the negative influence of the capping layer on the manufacturing process of the contact structure, and the contact structure may directly contact the electrically conductive layer. The electrical connection between the contact structure and the first stacked structure may be improved accordingly, and the manufacturing yield of the semiconductor device may be enhanced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
   a semiconductor substrate having a cell region and a peripheral region, wherein the semiconductor substrate comprises at least one fin-shaped structure isolated by an insulation structure;
   a first stacked structure disposed in the semiconductor substrate, wherein the first stacked structure is disposed straddling the at least one fin-shaped structure, extends in a horizontal direction, and is disposed in the cell region and the peripheral region, and the first stacked structure comprises:
      an electrically conductive layer comprising:
         a first portion located in the cell region; and
         a second portion located in the peripheral region;
      a capping layer disposed on the electrically conductive layer; and
      a dielectric capping layer disposed on the capping layer and the electrically conductive layer, wherein the dielectric capping layer contacts a top surface of the second portion of the electrically conductive layer; and
   a contact structure directly contacting the electrically conductive layer and electrically connected with the first stacked structure,
   wherein a sidewall of the capping layer faces the contact structure in the horizontal direction, and the contact structure directly contacts the sidewall of the capping layer.

2. The semiconductor device according to claim 1, wherein at least a part of the top surface of the second portion of the electrically conductive layer is not covered by the capping layer.

3. The semiconductor device according to claim 1, wherein a first bottom surface of the contact structure is located between the capping layer and a second bottom surface of the contact structure in the horizontal direction, and the second bottom surface is lower than the first bottom surface in a vertical direction.

4. The semiconductor device according to claim 1, wherein the dielectric capping layer directly contacts a top surface of the electrically conductive layer and a top surface of the capping layer.

5. The semiconductor device according to claim 1, further comprising:
   a second stacked structure disposed above the semiconductor substrate, wherein the second stacked structure is located on the cell region, the second stacked structure is disposed adjacent to an interface between the cell region and the peripheral region, and a distance between the sidewall of the capping layer and the contact structure in the horizontal direction is less than a distance between the second stacked structure and the contact structure in the horizontal direction.

6. The semiconductor device according to claim 1, wherein the electrically conductive layer comprises a metallic electrically conductive material, and the capping layer comprises doped polycrystalline silicon or undoped polycrystalline silicon.

7. The semiconductor device according to claim 1, further comprising:

a mask layer disposed on the first stacked structure, wherein the mask layer is partially located on the peripheral region, and the contact structure penetrates through the mask layer.

8. The semiconductor device according to claim 1, wherein a distance between the sidewall of the capping layer and the contact structure in the horizontal direction is less than a distance between the at least one fin-shaped structure and the contact structure in the horizontal direction.

9. A manufacturing method of a semiconductor device, comprising:

providing a semiconductor substrate having a cell region and a peripheral region, wherein the semiconductor substrate comprises at least one fin-shaped structure isolated by an insulation structure;

forming a first stacked structure in the semiconductor substrate, wherein the first stacked structure is formed straddling the at least one fin-shaped structure, extends in a horizontal direction, and is formed in the cell region and the peripheral region, and the first stacked structure comprises:

an electrically conductive layer comprising:

a first portion located in the cell region; and a second portion located in the peripheral region;

a capping layer disposed on the electrically conductive layer; and a dielectric capping layer disposed on the capping layer and the electrically conductive layer, wherein the dielectric capping layer contacts a top surface of the second portion of the electrically conductive layer; and forming a contact structure, wherein the contact structure directly contacts the electrically conductive layer and is electrically connected with the first stacked structure, a sidewall of the capping layer faces the contact structure in the horizontal direction, and the contact structure directly contacts the sidewall of the capping layer.

10. The manufacturing method of the semiconductor device according to claim 9, wherein a method of forming the first stacked structure comprises:

forming a trench in the semiconductor substrate, wherein the trench is partly located in the cell region and partly located in the peripheral region;

forming the electrically conductive layer in the trench;

forming the capping layer on the electrically conductive layer; and removing a part of the capping layer for exposing the top surface of the second portion of the electrically conductive layer.

11. The manufacturing method of the semiconductor device according to claim 10, wherein the method of forming the first stacked structure further comprises:

forming the dielectric capping layer in the trench after the part of the capping layer is removed.

12. The manufacturing method of the semiconductor device according to claim 11, wherein the sidewall of the capping layer is located above the second portion of the electrically conductive layer after the part of the capping layer is removed.

13. The manufacturing method of the semiconductor device according to claim 9, further comprising:

forming a second stacked structure above the semiconductor substrate after the first stacked structure is formed, wherein the second stacked structure is located on the cell region, the second stacked structure is disposed adjacent to an interface between the cell region and the peripheral region, and a distance between the sidewall of the capping layer and the contact structure in the horizontal direction is less than a distance between the second stacked structure and the contact structure in the horizontal direction.

14. A semiconductor device, comprising:

a semiconductor substrate having a cell region and a peripheral region, wherein the semiconductor substrate comprises at least one fin-shaped structure isolated by an insulation structure;

a first stacked structure disposed in the semiconductor substrate, wherein the first stacked structure is disposed straddling the at least one fin-shaped structure, extends in a horizontal direction, and is disposed in the cell region and the peripheral region, and the first stacked structure comprises:

an electrically conductive layer comprising:

a first portion located in the cell region; and a second portion located in the peripheral region;

a capping layer disposed on the electrically conductive layer; and a dielectric capping layer disposed on the capping layer and the electrically conductive layer, wherein the dielectric capping layer contacts a top surface of the second portion of the electrically conductive layer; and a contact structure directly contacting the electrically conductive layer and electrically connected with the first stacked structure, wherein the contact structure further contacts the capping layer directly, a first bottom surface of the contact structure is located between the capping layer and a second bottom surface of the contact structure in the horizontal direction, and the second bottom surface is lower than the first bottom surface in a vertical direction.

15. The semiconductor device according to claim 14, wherein at least a part of the top surface of the second portion of the electrically conductive layer is not covered by the capping layer.

16. The semiconductor device according to claim 14, wherein a sidewall of the capping layer faces the contact structure in the horizontal direction, and the contact structure directly contacts the sidewall of the capping layer.

17. The semiconductor device according to claim 14, wherein the dielectric capping layer directly contacts a top surface of the electrically conductive layer and a top surface of the capping layer.

18. The semiconductor device according to claim 14, further comprising:

a second stacked structure disposed above the semiconductor substrate, wherein the second stacked structure is located on the cell region, the second stacked structure is disposed adjacent to an interface between the cell region and the peripheral region, and a distance between a sidewall of the capping layer and the contact structure in the horizontal direction is less than a distance between the second stacked structure and the contact structure in the horizontal direction.

19. The semiconductor device according to claim 14, wherein the electrically conductive layer comprises a metallic electrically conductive material, and the capping layer comprises doped polycrystalline silicon or undoped polycrystalline silicon.

20. The semiconductor device according to claim 14, wherein a sidewall of the capping layer faces the contact structure in the horizontal direction, and a distance between the sidewall of the capping layer and the contact structure in the horizontal direction is less than a distance between the at least one fin-shaped structure and the contact structure in the horizontal direction.

* * * * *